(12) United States Patent
Kurosawa

(10) Patent No.: US 11,462,445 B2
(45) Date of Patent: Oct. 4, 2022

(54) SEMICONDUCTOR MODULE AND SEMICONDUCTOR-MODULE DETERIORATION DETECTING METHOD

(71) Applicant: FUJI ELECTRIC CO., LTD., Kawasaki (JP)

(72) Inventor: Eiji Kurosawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/386,822

(22) Filed: Jul. 28, 2021

(65) Prior Publication Data

US 2022/0059419 A1   Feb. 24, 2022

(30) Foreign Application Priority Data

Aug. 24, 2020   (JP) .............................. JP2020-140940

(51) Int. Cl.
| | | |
|---|---|---|
| *H01L 21/66* | (2006.01) | |
| *H03K 17/081* | (2006.01) | |
| *G01R 31/28* | (2006.01) | |
| *H03K 19/20* | (2006.01) | |

(52) U.S. Cl.
CPC .......... *H01L 22/34* (2013.01); *G01R 31/2853* (2013.01); *G01R 31/2896* (2013.01); *H03K 17/08116* (2013.01); *H03K 19/20* (2013.01)

(58) Field of Classification Search
CPC . H01L 22/34; G01R 31/2853; G01R 31/2896; G01R 31/261; G01R 31/3275; G01R 31/2601; G01R 31/2608; H03K 17/08116; H03K 19/20; H03K 17/0828; H03K 17/18

USPC ................... 324/762.02, 762.01, 537, 500
See application file for complete search history.

(56) References Cited

U.S. PATENT DOCUMENTS

| | | | | |
|---|---|---|---|---|
| 2005/0082647 | A1* | 4/2005 | Lee ................... | H01L 23/49572 257/668 |
| 2007/0125449 | A1* | 6/2007 | Kajiwara ................ | H01L 24/29 257/E23.04 |
| 2008/0303138 | A1* | 12/2008 | Flett ....................... | H01L 23/473 257/E23.098 |
| 2017/0330810 | A1 | 11/2017 | Joko et al. | |
| 2019/0172763 | A1 | 6/2019 | Joko et al. | |

FOREIGN PATENT DOCUMENTS

| | | |
|---|---|---|
| JP | 200922084 A | 1/2009 |
| JP | 201755610 A | 3/2017 |
| JP | 2017123704 A | 7/2017 |
| JP | 2017208382 A | 11/2017 |

* cited by examiner

*Primary Examiner* — Giovanni Astacio-Oquendo

(57) ABSTRACT

A semiconductor module including a semiconductor element which is bonded to a wiring pattern part and connects or disconnects two main electrode terminals to or from each other according to a drive signal applied to a gate electrode terminal, includes a deterioration detecting circuit configured to use one main electrode terminal of the two main electrode terminals of the semiconductor element with an applied DC voltage, as a reference potential, and detect deterioration of a joining part of the semiconductor element on the basis of a gate voltage which is the voltage between the one main electrode terminal and the gate electrode terminal and an inter-main-electrode voltage which is the voltage between the one main electrode terminal and the other main electrode terminal, and outputs an alarm signal.

8 Claims, 5 Drawing Sheets

SEMICONDUCTOR MODULE AND SEMICONDUCTOR-MODULE DETERIORATION DETECTING METHOD

CROSS-REFERENCE TO RELATED APPLICATIONS

The present application claims priority from Japanese Patent Application No. 2020-140940, filed Aug. 24, 2020, the entire content of which is incorporated herein by reference.

TECHNICAL FIELD

The present invention relates to a technology for detecting deterioration of a semiconductor module, such as an IPM (Intelligent Power Module), configured by integrating an IGBT chip for power conversion and a drive function and a protection function for the IGBT into one package.

BACKGROUND ART

In general, intelligent power modules (IPMs) have semiconductor elements (power devices) such as insulated gate bipolar transistors (IGBTs) and freewheeling diodes (FWDs) and have a function of controlling driving of the semiconductor elements.

FIG. 5 shows an example of the structure of an IPM. By the way, the following description will be made using an IGBT as an example of a semiconductor element. In FIG. 5, in a semiconductor module 1, a metal plate 54 is bonded on a metal base 52, for example, with a solder layer 53 interposed therebetween. On the upper surface of the metal plate 54, an insulting plate 55 composed of an alumina ceramic or the like is disposed. On the upper surface of the insulting plate 55, wiring pattern parts 56 and 57 are disposed, and on the upper surface of the wiring pattern part 56, an IGBT 2 is bonded by a solder layer 58. Further, between the IGBT 2 and the wiring pattern part 57, a wire 59 is bonded. On the metal base 52, a cooling fan 51 is attached.

Herein, the metal plate 54 and the wiring pattern parts 56 and 57 can be formed by directly bonding copper patterns on the insulting plate 55 by, for example, a direct copper bond (DCB) method. Incidentally, the DCB method is a method of bonding metal circuit patterns on an insulting plate by a eutectic reaction. Hereinafter, the insulting plate 55, the metal plate 54, and the wiring pattern parts 56 and 57 bonded by the DCB method will be referred to as the insulating circuit board 60. A structure including a control board and main electrode terminals (a collector terminal and an emitter terminal) for driving the IGBT 2, and wiring are detailed in, for example, JP2017-208382A and JP2017-055610A.

The IGBT chip 2 and the insulating circuit board 60 have joining parts shown by a reference symbol "A" in FIG. 5, and these joining parts are affected by the circuit operation. FIG. 6 shows an example of an equivalent circuit of an IPM 1 using the insulating circuit board 60.

As shown in FIG. 6, the IGBT chip 2 has a collector 2c, which is connected to a collector terminal 11 through the wiring pattern part 56 and is affected by a resistance component 4 between the solder layer 58 and the wiring pattern part 56 placed under the IGBT chip. Further, the IGBT chip 2 has an emitter 2e, which is connected to an emitter terminal 12 through the wire 59 and the wiring pattern part 57, and is affected by their resistance components.

Meanwhile, in a control circuit, a P-channel MOSFET 26 and an N-channel MOSFET 27 are connected in series, and the source of the P-channel MOSFET 26 is connected to a power source (Vcc), and the source of the N-channel MOSFET 27 is connected to a reference potential (GND). By the way, the power source (Vcc) and the reference potential (GND) are connected to an external power source through a Vcc terminal 41 and a GND terminal 42, respectively. Further, the contact point of the P-channel MOSFET 26 and the N-channel MOSFET 27 is connected to a gate terminal 13 of the IGBT 2. Furthermore, the output of a drive amplifier 28 is connected to the gates of the P-channel MOSFET 26 and the N-channel MOSFET 27, and selectively turned on and off the two MOSFETs 26 and 27 in response to a drive signal 44. As a result, the IGBT 2 is turned on and off. Specifically, when the drive signal 44 is at a low level, the drive amplifier 28 turns off the P-channel MOSFET 26 and turns on the N-channel MOSFET 27, thereby turning off the IGBT chip 2. Further, when the drive signal 44 is at a high level, the drive amplifier 28 turns on the P-channel MOSFET 26 and turns off the N-channel MOSFET 27, thereby turning on the IGBT chip 2.

In general, power devices such as IGBTs are turned on and off, whereby a large amount of current flows, resulting in heat. This heat is transferred toward the metal base 52 through the insulating circuit board 60. At this time, the insulting plate 55 serves as a thermal resistance layer hard for the heat generated from the IGBT chip 2 to pass through. Recently, in order to facilitate the passage of the heat, efforts such as lowering the heat density have been made; however, cracks may be caused in the solder layer 58 positioned under the chip and the joining part between the IGBT chip 2 and the wire by temperature change attributable to the flow of current.

In the related art, technologies for detecting abnormality attributable to deterioration of a joining part of an IGBT chip have been proposed. For example, in JP2009-022084A, a technology for measuring the voltage between both ends of a wire connecting the emitter of an IGBT and a main electrode terminal when the gate is on and detecting deterioration abnormality when the measured voltage is equal to or higher than a reference voltage is disclosed. However, the technology of JP2009-022084A is for detecting deterioration of the joining part between the IGBT chip 2 and the wire 59, not for detecting deterioration of the joining part between the IGBT chip and the insulating circuit board 60.

SUMMARY

The present invention was made to deal with the circumstances of the related art, and an object of the present invention is to provide a semiconductor module and a semiconductor-module deterioration detecting method capable of easily detecting deterioration of a joining part of a semiconductor element such as an IGBT chip, i.e. a decrease in the strength of connection with a solder layer provided under the semiconductor element or a wire.

In order to achieve the above-mentioned object, a semiconductor module according to the present invention including a semiconductor element which is bonded to a wiring pattern part and connects or disconnects two main electrode terminals to or from each other according to a drive signal applied to a gate electrode terminal, includes:

a deterioration detecting circuit configured to use one main electrode terminal of the two main electrode terminals of the semiconductor element with an applied DC voltage, as a reference potential, and detect deterioration of a joining part of the semiconductor element on the basis of a voltage which is the voltage between the one main electrode terminal and the gate electrode terminal (hereinafter, a gate voltage) and a voltage which is the voltage between the one main electrode terminal and the other main electrode terminal (hereinafter, an inter-main-electrode voltage), and outputs an alarm signal.

Specifically, the deterioration detecting circuit is configured to compare the value of the gate voltage with a first reference voltage value, and is configured to compare the value of a divided voltage generated by dividing the inter-main-electrode voltage by resistors with a second reference voltage value. The deterioration detecting circuit is configured to output the alarm signal when the value of the gate voltage is equal to or larger than the first reference voltage value and the value of the divided voltage is equal to or larger than the second reference voltage value.

In the present invention, the inter-main-electrode voltage is monitored while the gate is on, and if the inter-main-electrode voltage or the divided voltage generated by dividing the inter-main-electrode voltage by the resistors becomes equal to or larger than a predetermined value (the second reference voltage value), it is determined that the joining part of the semiconductor element is deteriorating, and the alarm signal is output.

The deterioration detecting circuit can be configured with a first comparator that compares the value of the gate voltage and a first reference voltage value, and outputs a high level if the value of the gate voltage is equal to or larger than the first reference voltage value, a second comparator that compares the value of the inter-main-electrode voltage with a second reference voltage, and outputs a high level if the value of the inter-main-electrode voltage becomes equal to or larger than the second reference voltage value, and an AND circuit that calculates the logical conjunction of the output of the first comparator and the output of the second comparator.

Further, it is preferable to configure the first reference voltage value and the second reference voltage value such that they are adjustable. In this case, it becomes possible to set them to appropriate values according to the voltage to be applied between both main electrode terminals of an actual product.

Also, the deterioration detecting circuit of the semiconductor module according to the present invention is configured to compare the value of the gate voltage and a first reference voltage value, and is configured to compare the value of the divided voltage of the inter-main-electrode voltage with a third reference voltage value larger than a second reference voltage value, and is configured to block the drive signal to stop application of voltage to the gate terminal, when the value of the gate voltage is equal to or larger than the first reference voltage value and the value of the divided voltage is equal to or larger than the third reference voltage value.

In the present invention, when the voltage between the main electrode terminals when the gate is on is low, i.e. at the stage where the tendency of the resistance value of the joining part of the semiconductor element to rise is low, the alarm signal is output early to notify the outside that it tends to deteriorate. Further, if the resistance value of the joining part of the semiconductor element further increases, and the joining part may be about to be broken, before the joining part is broken, the drive signal is blocked (locked) to stop the operation of the semiconductor element. In this way, it is possible to prevent malfunctions and accidents of the system using the semiconductor module.

Also, a semiconductor-module deterioration detecting method according to the present invention is a method of detecting deterioration of a joining part in a semiconductor module including a semiconductor element which is solder bonded to a wiring pattern part and connects or disconnects two main electrode terminals to or from each other according to a drive signal applied to a gate electrode terminal. DC voltage is applied between the two main electrode terminals, and one main electrode terminal of the two main electrode terminals is used as a reference potential, and deterioration of the joining part of the semiconductor element is detected on the basis of a gate voltage which is the voltage between the one main electrode terminal and the gate electrode terminal and an inter-main-electrode voltage which is the voltage between the one main electrode terminal and the other main electrode terminal.

As described above, according to the present invention, it is possible to easily detect deterioration of the joining parts of the semiconductor element.

DESCRIPTION OF EMBODIMENTS

Hereinafter, an embodiment of a semiconductor module according to the present invention will be described with reference to the drawings.

Figure 1:
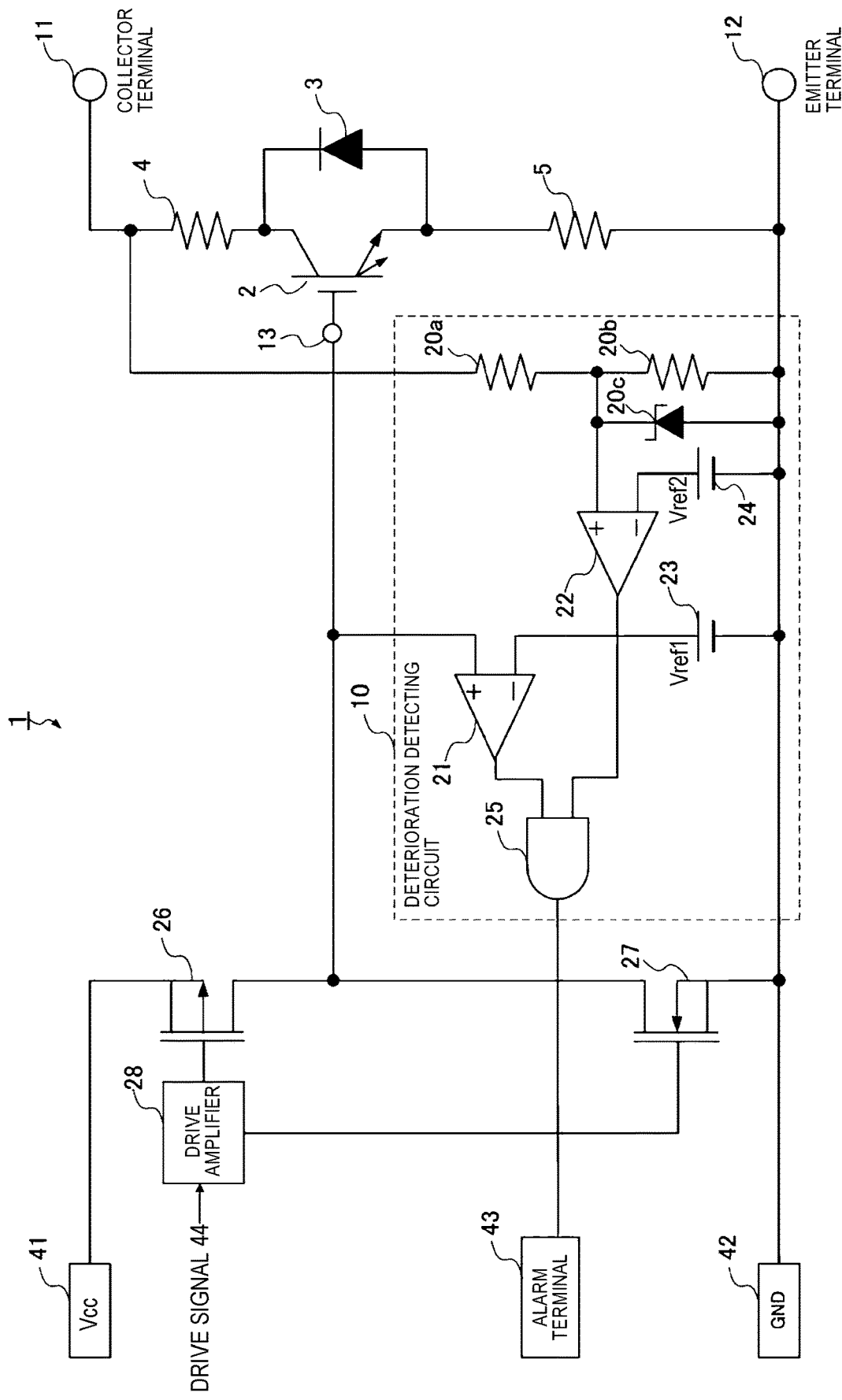
FIG. 1 is a circuit configuration diagram of a semiconductor module according to a first embodiment of the present invention.

FIG. 1 is a configuration diagram of a semiconductor module according to the present embodiment. It is characterized by further having a deterioration detecting circuit 10 as compared to FIG. 6.

Figure 6:
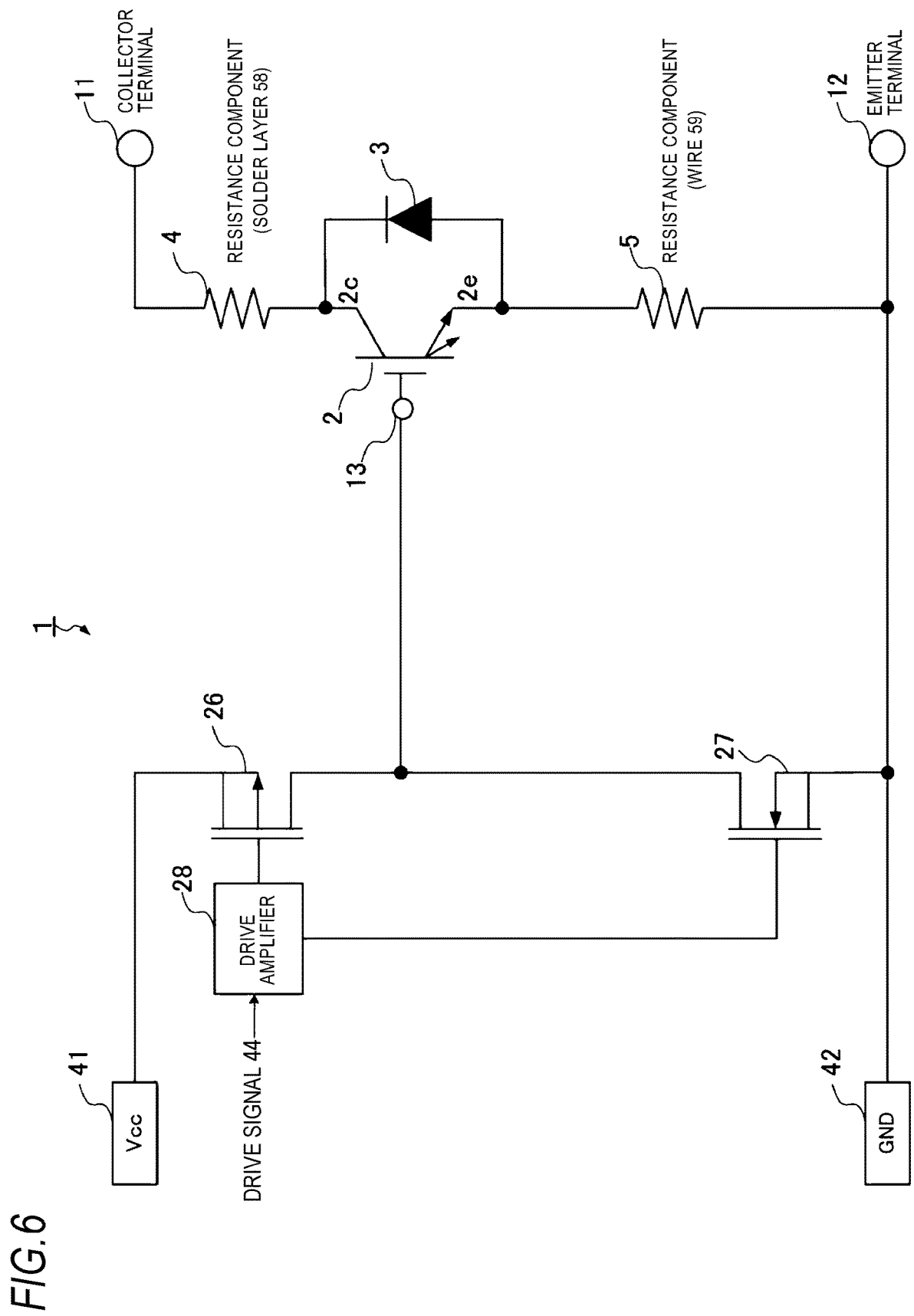
FIG. 6 is a circuit configuration diagram of a semiconductor module of the related art.

Hereinafter, a semiconductor module 1 according to the present embodiment will be described, mainly the deterioration detecting circuit 10. By the way, components identical to those in FIG. 6 are denoted by the same reference symbols, and a description thereof will not be made.

The deterioration detecting circuit 10 serves a function of outputting an alarm if the voltage between a gate terminal 13 and an emitter terminal 12 (hereinafter, referred to simply as the gate voltage) and a voltage which is detected by dividing the voltage between a collector terminal 11 and the emitter terminal 12 by resistors (hereinafter, referred to simply as the collector voltage) are reference voltages Vref1 (for example, about 13 V) and Vref2 (for example, about 3V), respectively.

The deterioration detecting circuit 10 includes comparators (differential voltage detectors) 21 and 22 and an AND circuit 25. The non-inverting input terminal of the comparator 21 is connected to the gate terminal 13 of the IGBT 2, and the inverting input terminal is connected to a reference voltage source 23. Between the collector terminal 11 and the emitter terminal 12, resistors 20a and 20b connected in series are interposed, and the contact point between the resistor 20a and the resistor 20b is connected to the non-inverting input terminal of the comparator 22. The inverting input terminal of the comparator 22 is connected to a reference voltage source 24. Further, the other terminals of reference voltage sources 23 and 24 are connected to a reference potential (GND). Furthermore, between the non-inverting input terminal of the comparator 22 and the reference potential, a voltage regulator diode 20c is interposed to protect the comparator 22 from surge voltage.

The output terminals of the comparators 21 and 22 are connected to the input terminals of the AND circuit 25, respectively. This AND circuit 25 is a logical conjunction operation circuit. In other words, when both of the outputs of the comparators 21 and 22 are at a high level, the output of the AND circuit 25 becomes a high level, and an alarm signal is enabled. When the outputs of the comparators 21 and 22 are in any other condition, the output of the AND circuit 25 becomes a low level.

When a drive signal 44 is in an OFF state, the P-channel MOSFET 26 is turned off, and the N-channel MOSFET 27 is turned on. In this case, charge is drawn from the gate terminal of the IGBT 2 toward the reference potential (GND). As a result, the IGBT 2 is turned off, and the voltage of the non-inverting input terminal of the comparator 21 becomes lower than the reference voltage Vref1. As a result, the output of the comparator 21 becomes the low level. Therefore, in this case, the output of the AND circuit 25 becomes the low level regardless of the output state of the comparator 22.

If the drive signal 44 becomes the ON state, the P-channel MOSFET 26 is turned on, and the N-channel MOSFET 27 is turned off. In this case, charge is supplied from the power source (Vcc) to the gate terminal of the IGBT 2. As a result, the IGBT 2 is turned on, and the voltage of the non-inverting input terminal of the comparator 21 becomes higher than the reference voltage Vref1. As a result, the output of the comparator 21 becomes the high level. In this case, the output of the AND circuit 25 varies depending on the output state of the comparator 22.

In the case where deterioration of the solder joining part positioned under the switching element and the wire joining part is not progressing, since the value of a resistance component 4 of the wiring pattern part and the value of a resistance component 5 of the wire are small, the collector voltage when the IGBT 2 is in the ON state is lower than the reference voltage Vref2. Therefore, the output of the comparator 22 becomes the low level, and as a result, the output of the AND circuit 25 also becomes the low level.

Meanwhile, if deterioration of the solder joining part positioned under the switching element and the wire joining part progresses, the resistance component 4 of the solder joining part positioned under the switching element and the resistance component 5 of the wire joining part increase. For this reason, the collector voltage when the IGBT 2 is in the ON state becomes larger than the reference voltage Vref2. Therefore, in this case, the output of the comparator 22 becomes the high level, and as a result, the output of the AND circuit 25 also becomes the high level. As a result, an alarm is output to the outside through an alarm terminal 43.

Figure 2:
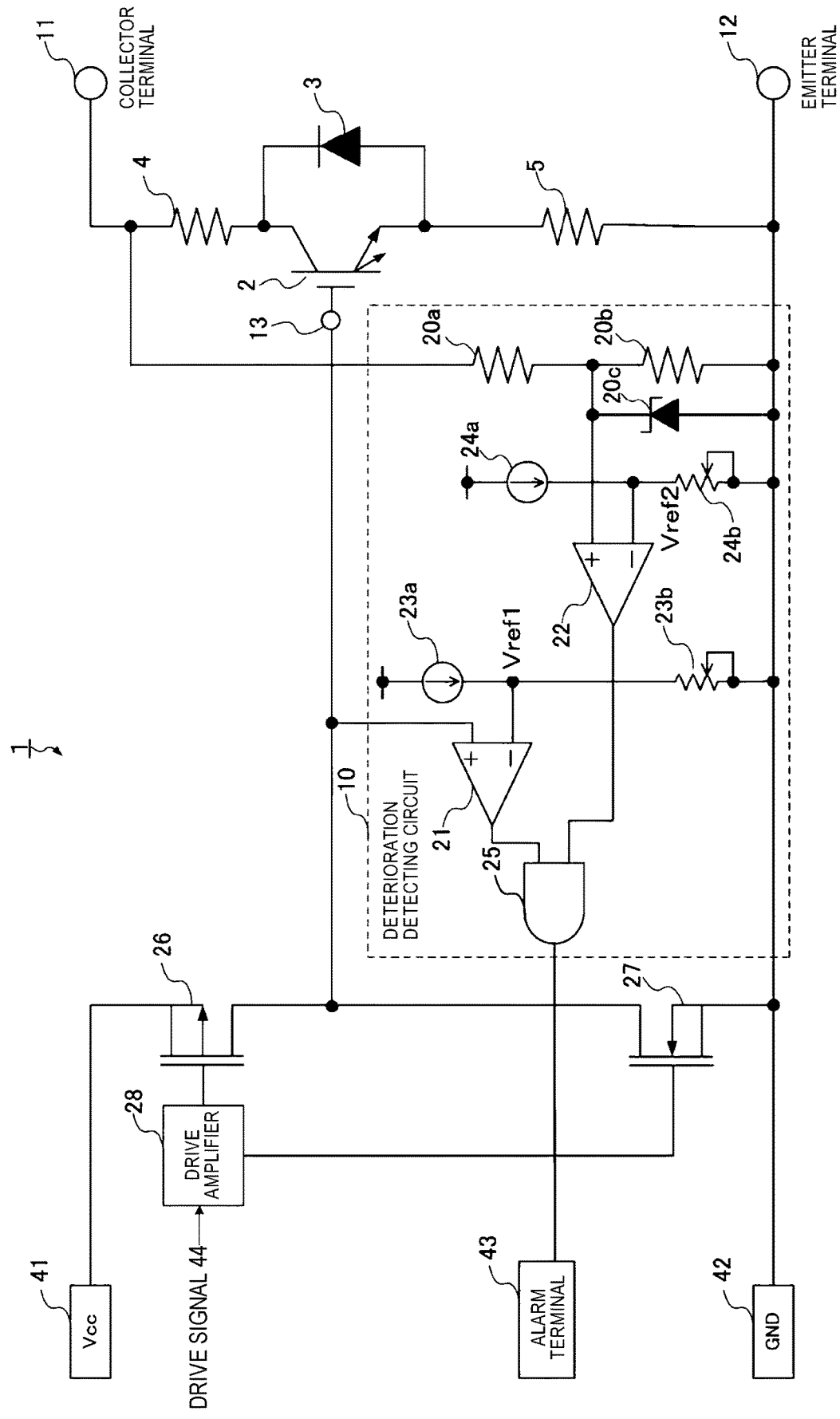
FIG. 2 is a circuit configuration diagram of a semiconductor module according to another example of FIG. 1.

By the way, the gate voltage and the collector voltage vary depending on the magnitude of the voltage which is applied between the collector terminal 11 and the emitter terminal 12. For this reason, it is preferable that the reference voltage Vref1 and Vref2 be adjustable. A circuit example thereof is shown in FIG. 2. A difference from FIG. 1 is that a reference voltage source is configured with constant-current sources and variable resistors. Specifically, the output of a constant-current source 23a is connected to one end of a variable resistor 23b and the inverting input terminal of the comparator 21, and the other end of the variable resistor 23b is connected to the reference potential (GND). Further, the output of the constant-current source 24a is connected to one end of a variable resistor 24b and the inverting input terminal of the comparator 22, and the other end of the variable resistor 24b is connected to the reference potential (GND).

In this configuration, it is preferable to set the reference voltage Vref1 to about an intermediate voltage between the gate voltage when the gate of the IGBT 2 is on and the gate voltage when the gate is off. In this case, it is possible to surely detect the on/off state of the gate with high accuracy. It is preferable to set the reference voltage Vref2 on the basis of the collector voltage which is generated when the gate of the IGBT 2 is on, in the event of deterioration abnormality of the solder joining part positioned under the semiconductor element or the wire joining part. On the basis of a deterioration curve shown in FIG. 4, it is preferable to set the reference voltage Vref2 to a low voltage in the case where it is desired to output an alarm at an early stage of deterioration, and to set the reference voltage Vref2 to a high voltage in the case where it is desired to output an alarm when deterioration progresses to a certain extent.

As described above, according to the present embodiment, when the gate of the IGBT is on, an alarm is output only when the collector voltage exceeds the reference voltage Vref2. Therefore, it is possible to easily detect deterioration of the joining parts of the IGBT chip.

Now, a second embodiment of the present invention will be described.

Figure 3:
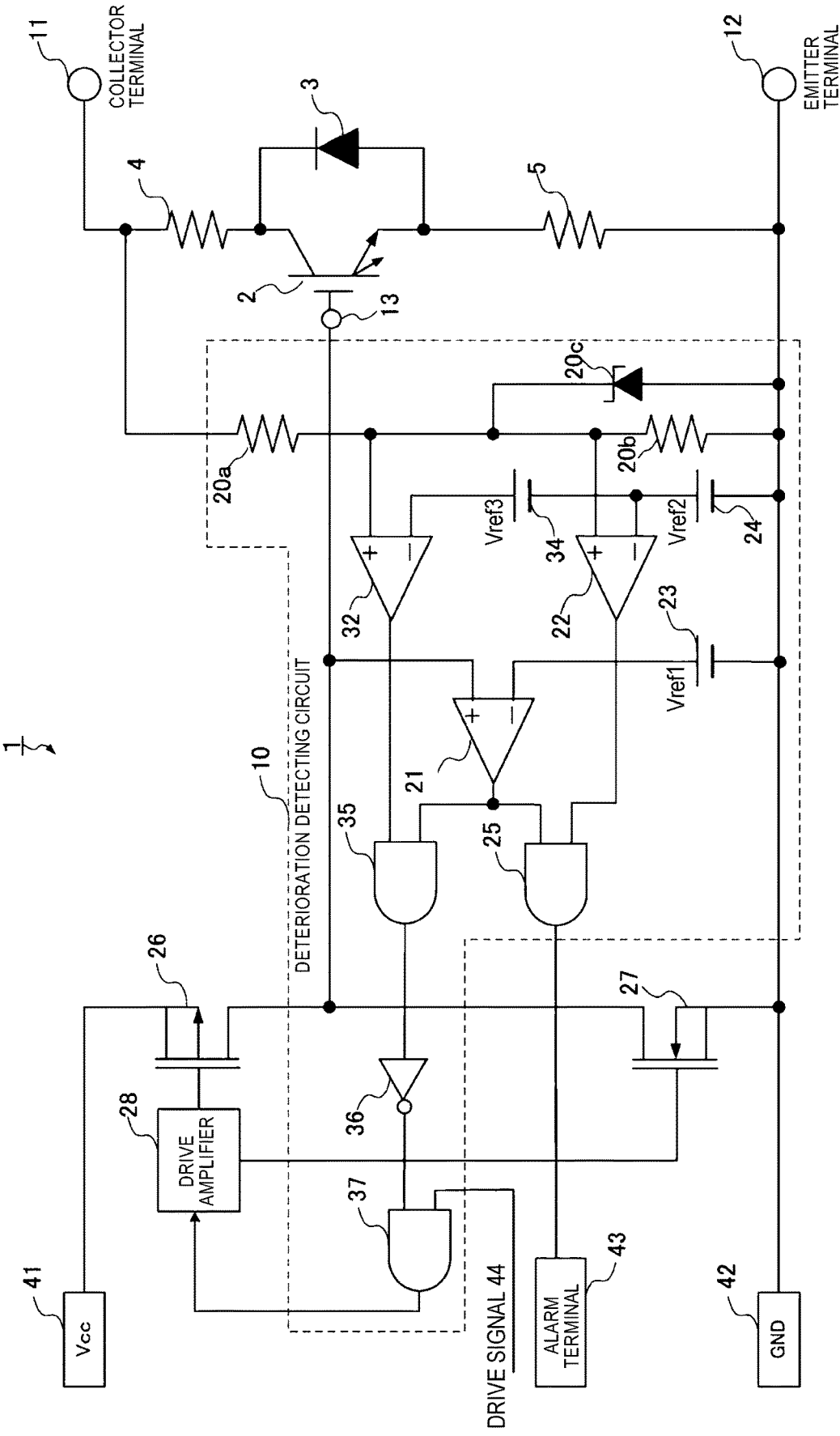
FIG. 3 is a circuit configuration diagram of a semiconductor module according to a second embodiment of the present invention.

FIG. 3 is a configuration diagram of a semiconductor module according to the present embodiment. The main difference from FIG. 1 is that a comparator 32 is added to the deterioration detecting circuit 10 to compare the collector voltage and a reference voltage (Vref2+Vref3). The logical conjunction of the output of the comparator 32 and the output of the comparator 21 is calculated by an AND circuit 35. The output of the AND circuit 35 is connected to a NOT circuit 36. The logical conjunction of the output of the NOT circuit 36 and the drive signal 44 is calculated by an AND circuit 37. The output of the AND circuit 37 is supplied to a drive amplifier 28.

In the configuration of FIG. 3, if the collector voltage value when the gate of the IGBT chip 2 is on is smaller than the value of the reference voltage (Vref2+Vref3), the output of the NOT circuit 36 becomes a high level, whereby supply of the drive signal 44 to the drive amplifier 28 is allowed. Meanwhile, when the collector voltage value is equal to or larger than the reference voltage (Vref2+Vref3), the output of the NOT circuit 36 becomes a low level, whereby supply of the drive signal 44 to the drive amplifier 28 is prohibited. The other configuration is the same as that of FIG. 1, so identical elements are denoted by the same reference symbols, and a description thereof will not be made.

A feature of the present embodiment is that the collector voltage is compared with two different reference voltage values. Further, the result of the comparison with the low voltage value Vref2 is used to output an alarm to the outside through the alarm terminal 43, and the result of the comparison with the high voltage value (Vref2+Vref3) is used to prohibit supply of the drive signal 44 to the drive amplifier 28, thereby turning off the IGBT 2. By the way, even in FIG.

3, it is preferable to configure the reference voltages Vref1, Vref2, and Vref3 such that they are adjustable, similarly to FIG. 2.

Figure 4:
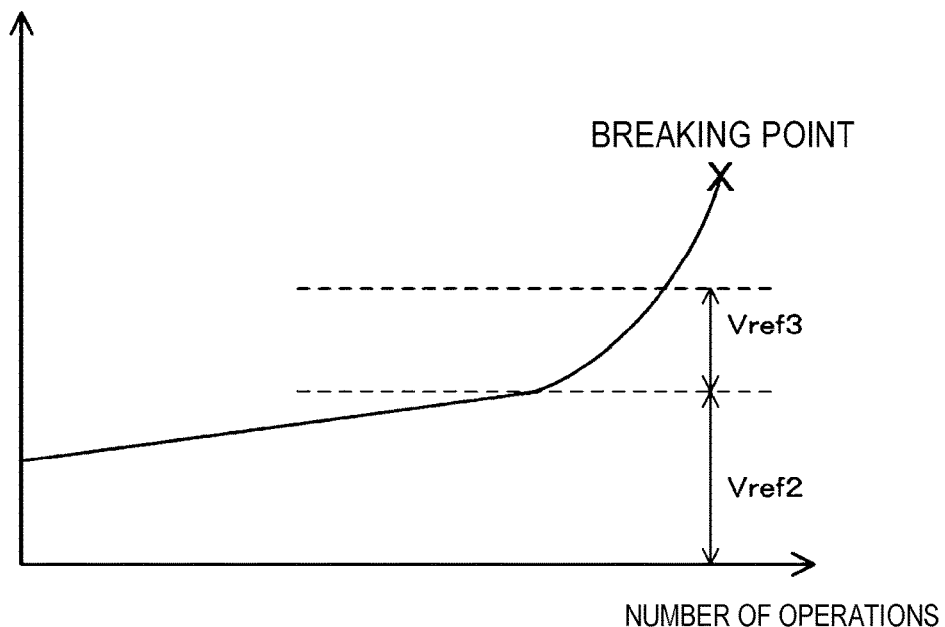
FIG. 4 is an explanatory view illustrating change in the resistance value (the voltage value between main electrodes) of a solder joining part provided under a semiconductor element and a wire joining part during a power cycle.
Figure 5:
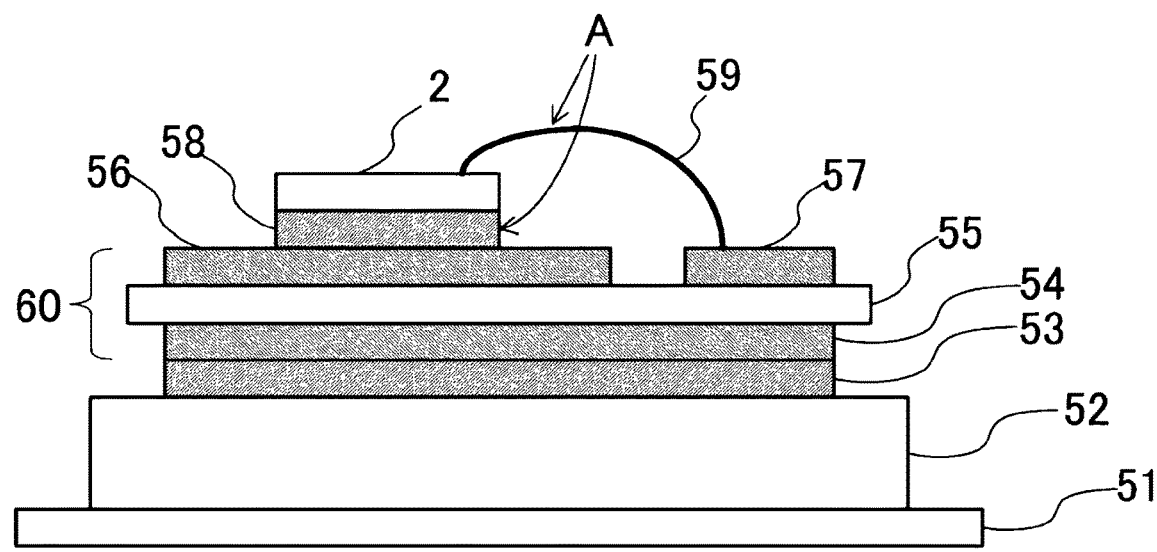
FIG. 5 is an explanatory view of the structure of an IGBT using an insulating circuit board.

In general, the resistance values of the joining parts vary as shown in FIG. 4. Therefore, at a time point when the inclination is small, an alarm is output, and if the inclination increases, the protection function is operated to prohibit the drive signal 44, thereby preventing the gate from being turned on. In this way, if deterioration of a joining part progresses, the protection function is operated, and before the protection function is operated, an alarm can be output to give time to take a countermeasure systematically.

The present invention is not limited to the above-described embodiments, and it is possible to implement various modifications without departing the gist of the present invention. For example, the gate voltage may be compared with two voltage reference values, a low voltage reference value and a high voltage reference value, such that when the gate voltage exceeds the high voltage reference value, deterioration abnormality of the wire 59 is determined. In this case, deterioration of the wire joining part can be distinguished from deterioration of the solder joining part positioned under the semiconductor element. Also, although the IGBT has been described as an example of the power device in the above embodiments, it goes without saying that the present invention can also be applied to MOSFETs. Also, in the above-described circuit configurations, selection of component ratings, constants, and so on, and adjustment of signal delay and so on can be appropriately carried out.

What is claimed is:

1. A semiconductor module including a semiconductor element which is bonded to a wiring pattern part and connects or disconnects two main electrode terminals to or from each other according to a drive signal applied to a gate electrode terminal, comprising:
    a deterioration detecting circuit configured to use one main electrode terminal of the two main electrode terminals of the semiconductor element with an applied DC voltage, as a reference potential, and detect deterioration of a joining part of the semiconductor element on the basis of a gate voltage which is the voltage between the one main electrode terminal and the gate electrode terminal and an inter-main-electrode voltage which is the voltage between the one main electrode terminal and the other main electrode terminal, and outputs an alarm signal.

2. The semiconductor module according to claim 1, further comprising:
    a terminal for outputting the alarm signal to the outside.

3. The semiconductor module according to claim 1,
    wherein the deterioration detecting circuit is configured to compare the value of the gate voltage with a first reference voltage value, and is configured to compare the value of a divided voltage generated by dividing the inter-main-electrode voltage by resistors with a second reference voltage value, and
    wherein the deterioration detecting circuit is configured to output the alarm signal when the value of the gate voltage is equal to or larger than the first reference voltage value and the value of the divided voltage is equal to or larger than the second reference voltage value.

4. The semiconductor module according to claim 1,
    wherein the deterioration detecting circuit further includes:
        a first comparator that is configured to compare the value of the gate voltage and a first reference voltage value, and is configured to output a high level when the value of the gate voltage is equal to or larger than the first reference voltage value;
        a second comparator that is configured to compare the value of a divided voltage generated by diving the inter-main-electrode voltage by resistors with a second reference voltage value, and is configured to output a high level when the value of the divided voltage becomes equal to or larger than the second reference voltage value; and
        an AND circuit that is configured to calculate the logical conjunction of the output of the first comparator and the output of the second comparator.

5. The semiconductor module according to claim 4,
    wherein the first reference voltage value and the second reference voltage value are adjustable.

6. The semiconductor module according to claim 3,
    wherein the deterioration detecting circuit is configured to compare the value of the gate voltage and a first reference voltage value, and is configured to compare the value of the divided voltage of the inter-main-electrode voltage with a third reference voltage value larger than a second reference voltage value, and is configured to block the drive signal to stop application of voltage to the gate terminal, when the value of the gate voltage is equal to or larger than the first reference voltage value and the value of the divided voltage is equal to or larger than the third reference voltage value.

7. A semiconductor-module deterioration detecting method of detecting deterioration of a joining part in a semiconductor module including a semiconductor element which is bonded to a wiring pattern part and connects or disconnects two main electrode terminals to or from each other according to a drive signal applied to a gate electrode terminal,
    wherein DC voltage is applied between the two main electrode terminals, and one main electrode terminal of the two main electrode terminals is used as a reference potential, and deterioration of the joining part of the semiconductor element is detected on the basis of a gate voltage which is the voltage between the one main electrode terminal and the gate electrode terminal and an inter-main-electrode voltage which is the voltage between the one main electrode terminal and the other main electrode terminal.

8. The semiconductor-module deterioration detecting method according to claim 7,
    wherein the value of the gate voltage is compared with a first reference voltage value, and the value of a divided voltage generated by dividing the inter-main-electrode voltage by resistors is compared with a second reference voltage value, and when the value of the gate voltage is equal to or larger than the first reference voltage value and the value of the divided voltage is equal to or larger than the second reference voltage value, it is determined that the joining part of the semiconductor element has deteriorated.

* * * * *